(12) United States Patent
Amick et al.

(10) Patent No.: US 8,358,158 B2
(45) Date of Patent: Jan. 22, 2013

(54) METHOD AND APPARATUS FOR PHASE SELECTION ACCELERATION

(75) Inventors: Brian W. Amick, Bedford, MA (US);
Ryan J. Hensley, Austin, TX (US);
Warren R. Anderson, Westborough, MA (US); Joseph E. Kidd, Hudson, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 10 days.

(21) Appl. No.: 12/974,501

(22) Filed: Dec. 21, 2010

(65) Prior Publication Data
US 2012/0154011 A1 Jun. 21, 2012

(51) Int. Cl.
*H03L 7/06* (2006.01)

(52) U.S. Cl. ......... 327/147; 327/150; 327/156; 327/159

(58) Field of Classification Search .................. 327/147, 327/150–151, 156, 159–161
See application file for complete search history.

(56) References Cited

U.S. PATENT DOCUMENTS

| | | | | |
|---|---|---|---|---|
| 5,126,691 | A * | 6/1992 | Mijuskovic et al. | 331/1 A |
| 6,687,321 | B1 * | 2/2004 | Kada et al. | 375/376 |
| 6,782,064 | B1 | 8/2004 | Schwake | |
| 6,791,379 | B1 * | 9/2004 | Wakayama et al. | 327/156 |
| 7,088,154 | B2 * | 8/2006 | Ngo | 327/113 |

OTHER PUBLICATIONS

Yang, Chih-Kong Ken, "Delay-Locked Loops—An Overview" Phase Locking in High-Performance Systems, IEEE Press, 2003 (pp. 13-22).

* cited by examiner

*Primary Examiner* — An Luu
(74) *Attorney, Agent, or Firm* — Volpe and Koenig, P.C.

(57) ABSTRACT

A method and apparatus for generating a clock that can be switched in phase within a reduced interval of dead time are disclosed.

19 Claims, 2 Drawing Sheets

METHOD AND APPARATUS FOR PHASE SELECTION ACCELERATION

FIELD OF INVENTION

This application is related to processors and methods of processing.

BACKGROUND

The operation of a processor's (e.g., CPU's) physical interface in an advanced memory sub-system often involves the use of multiple clocks running at different speeds. In particular, the memory sub-system may be required to propagate data over a high-speed serializer/deserializer (serdes) link, operating at 6.4 gigabytes per second (Gb/s) or greater, but may also be required to interface with the traditional double data rate three (DDR3) memory around the much slower 1.6 Gb/s. Although slower, DDR3 memory (e.g., dynamic random access memory (DRAM), synchronous DRAM (SDRAM) and the like) adds the complexity of data bus bursts, where each burst may be directed at a different memory dual inline memory module (DIMM) or rank on a DIMM, each of which requires a different phase shift of the data output from the CPU in order to meet the input timing requirements at the DRAM to which the burst is targeted.

Typical memory modules are organized as either 64 or 72 bit-wide words. The depth and width of the module define the total density of the DIMM. For example, a 128 Mbyte wide× 72 bit width is a 1 GB DIMM (128 M×8=1 GB). The configuration and density of the components used on a module define the number of ranks.

Each single rank on a module forms an identical arrangement of memory components to the other ranks. The term "rank" evolved from the need to distinguish the number of memory banks on a module as opposed to the number of memory banks on a component. So, "rank" is used when referring to modules, and "bank" is used when referring to components. The most commonly used modules have either a single rank of memory or a double rank of memory.

A DDR memory system requires a timing generator to provide a clock waveform meeting specific phase requirements to the I/O links of the memory (e.g., DRAM). The specific clock used for an output signal can be considered to meet requirements if using that clock for a transaction results in the memory receiving the transaction as intended, according to the standards defined by the Joint Electron Device Engineering Council (JEDEC) industry working group. The specific clock waveform used for an input signal can be considered to meet timing requirements if using that clock during a read transaction results in correctly sampling the intended data from the memory.

A timing generator may be required to create multiple different clock waveforms within a system at different points in time. These clocks could be differentiated by usage in output signals versus input signals, usage by a specific set of related I/O signals versus a different set of I/O signals, usage when addressing a different DIMM or a different rank on the same DIMM, or usage to meet the current timing requirements versus different requirements that the same piece of hardware may require in the future as parameters change in the memory.

In conventional systems, a delay-locked loop (DLL) running at the memory module (e.g., DDR3) frequency generates multiple output phases. During the phase switching operation between data bursts, a control system running at this same frequency stops the DLL's output, feeds in the new phase operation, and re-starts the DLL. Because this sequence is driven from a lower-speed clock, the duration of the phase switching is longer, causing pending data traffic to stall, which decreases the throughput of the memory subsystem, decreasing system performance.

SUMMARY OF THE EMBODIMENTS

A method and apparatus for phase selection wherein a clock selection has a reduced interval of dead time are disclosed.

DETAILED DESCRIPTION

Figure 1:
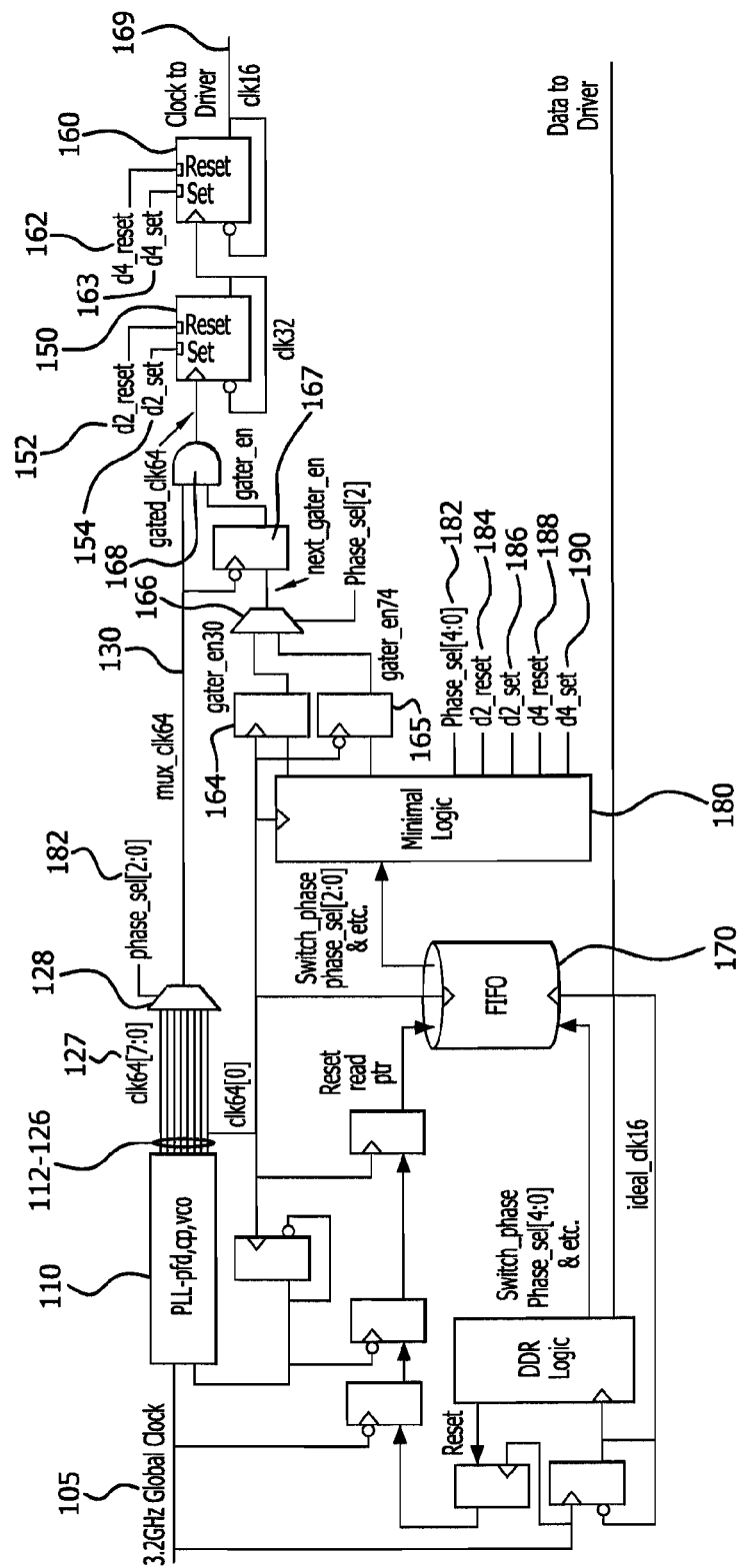
FIG. 1 is a block diagram of an example of one implementation of an accelerated phase switching entity.

Referring to FIG. 1, in an example accelerated phase switching entity, a 3.2 gigahertz (GHz) global clock signal 105 is input into a phase locked loop (PLL) 110. The PLL (or an appropriate signal generation component in the PLL) generates eight 6.4 GHz clock signals 112-126. Each clock (signal) preferably has the same frequency, and a known phase shift. The eight clock signals 112-126 are passed through a multiplexer (mux) 128. The mux 128 performs a phase selection 182 and selects one of the eight 6.4 GHz clock signals 130. Phase selection 182 is based upon information from a first in first out (FIFO) device 170 that is input into a minimal logic entity 180 for processing and generating output. The minimal logic entity 180 takes the phase information and resets the divider in order to start it in the correct quadrant. For example, selecting phase 0 means that the divider should start with a 00 in both divider flip-flops, then move to 01, then 10, then 11, where the output is the left most of the two bits. The logic takes the desired phase information and seeds the divider with the correct values to set the proper phase to use.

Thus, the output of the minimal logic entity 180 includes phase selection 182 and flip-flop set and reset information (d2_reset 184, d2_set 186, d4_reset 188, d4_set 190). In this example, the minimal logic entity 180 maps phase_sel[4:3] (the upper 2 bits) onto the d2_reset, d2_set, d4_reset, and d4_set signals. The selected clock signal 130 passes through two flip flops d2 150, d4 160. The flip flops d2 150 (including d2_set 154 and d2_reset 152), d4 160 (including d4_set 163 and d4_reset 162) are configured according the output from the minimal logic entity 180 to generate a new clock 1.6 GHz clock signal 169 from selected clock signal 130.

The above example provides phase generation control (phase control) based on a global reference clock. Dividing in a phase-controlled manner refers to the process described above for the minimal logic entity 180. For example, dividing a clock by 4 allows for 4 coarse phase settings depending on how the divider is seeded. The divider may be seeded with a 00 as above, a 01, a 10, or a 11. The result in each case will be a divided clock with a phase shifted by ¼ cycle. The phase controlled manner is a means to set that phase to the desired timing through seeding the divider with the correct starting value.

A general multiplying PLL (e.g., a double phase locked loop (2×PLL)) provides the eight clock signals, where each clock signal has a known phase shift, from a voltage control oscillator (VCO) or equivalent signal generating device. The phases preferably have a resolution of ¹⁄₃₂ of a unit interval, where a unit interval is defined as the duration of one data bit over a transmission medium, and the PLL bandwidth is preferably in the range of 100-300 MHz to provide good tracking between output phases and a reference clock. In this example, a 1.6 GHz clock signal is ultimately generated from a 6.4 GHz clock signal. Data is transmitted once every clock cycle. Therefore, a unit interval in this example is equal to the period of the 1.6 GHz clock, or 625 ps. The phase resolution is 625 ps/32 or 19.53 ps.

The desired phase (the phase required to create a clock with the appropriate signal timing) is preferably selected based on information output from a minimal logic entity and a fractional (e.g., one quarter (¼)) speed output clock is generated. This method of phase selection results in less than or equal to only one unit interval of dead time thereby only allowing relatively small "bubbles" when changing clock timings. (A bubble is a gap in time from when data becomes unusable, in terms of providing the correct clock from the memory transaction, to when data becomes usable.)

A streamlined control pipeline keeps the duration of the clock phase transition (bubble) low. The control pipeline initiates a clock phase transition through a data path that writes phase settings and control bits into the FIFO queue 170. The control pipeline stops the output clock and selects a new clock phase based on the phase settings. A minimal amount of clock gater logic (in the minimal logic entity 180) determines how to cleanly gate the multiplexer (mux) output clock if a phase change is needed to obtain the clock with the selected phase. Phase switching control is from a 1.6 GHz clock and the phase switching results in 6.4 GHz cycles that change the clock being selected by the mux and reset/set the flops to get the correct starting location. Upon de-assertion of the switch control signal, the clock gater logic works as described above, but its polarity is reversed, allowing the clock to restart cleanly. The latency of the FIFO is determined once at start up by walking a reset signal that initializes the read port of the FIFO across the PLL 110 (e.g., 2×PLL), thereby creating a known latency between the write and the read port of the FIFO 170 queue.

Figure 2:
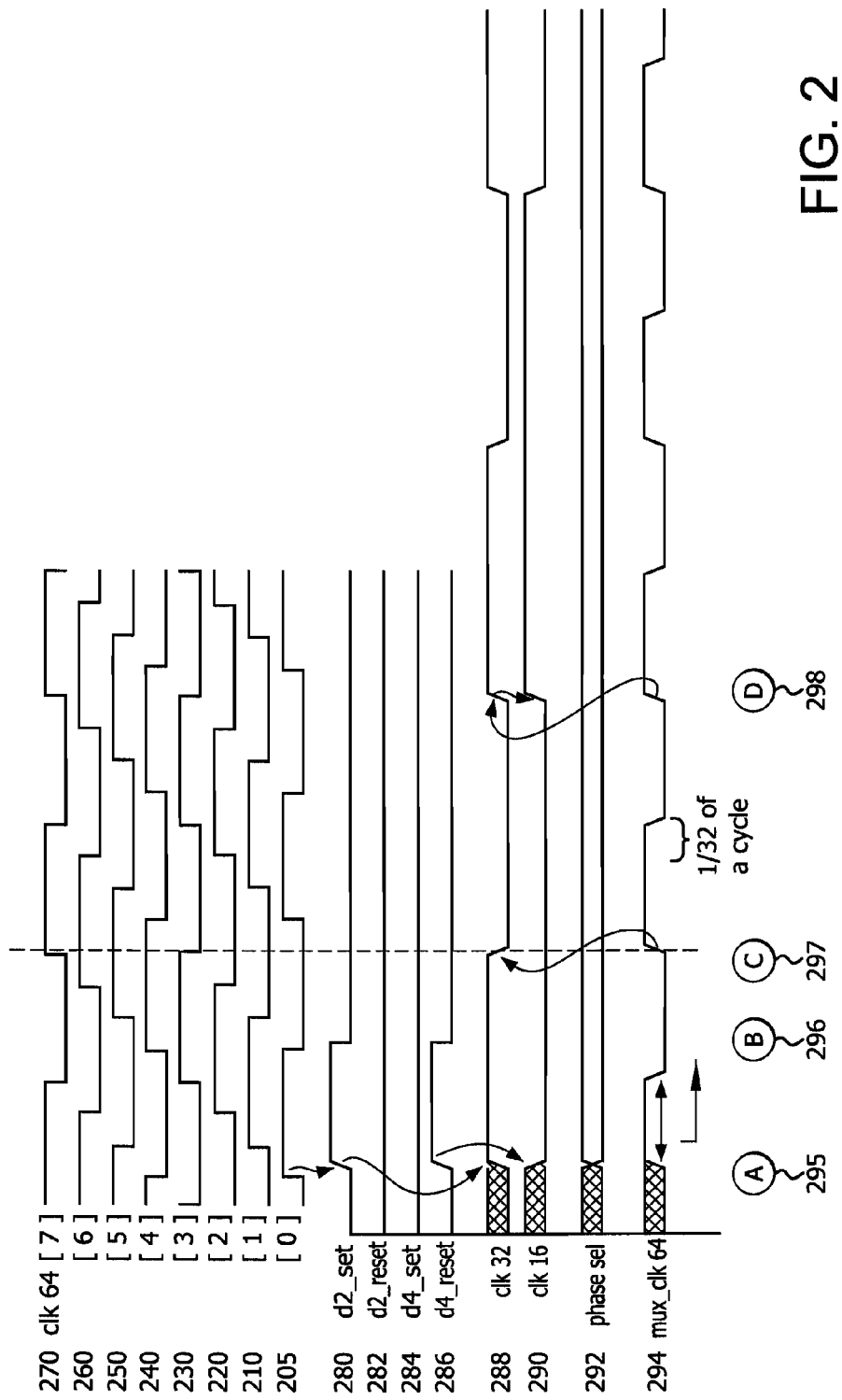
FIG. 2 is a timing diagram of an example of a signal pattern resulting from the FIG. 1 implementation.

FIG. 2 shows an example of clock (phase) switching acceleration that is a characteristic of the present invention. At time "A" 295, control signals have been pulled out of the FIFO 170 (from FIG. 1) to indicate the start of a (or another) transaction, and that in the range of clocks 0 to 31, clock #7 is chosen.

Since #7 is in the range of [0,7], divide-by-2 (d2)_set 152 and divide-by-4 (d4)_reset 162 are pulsed to put the clock dividers into the appropriate state. To initialize for any of the other ranges such as [8,15], [16,23], or [24,31], other choices may be used for set/reset of the flip flop d2 150 and the flip flop d4 160 (in this case, dividers) initial conditions.

In other words, clock selection in the [0,31] range modulo 8, in this case 7 modulo 8, results in 7. Those data bits (binary 111) are sent to control the mux 128 which selects one of the eight clock signal versions (112-126) of clk64 127. In this example, clock signal 126 gets propagated to mux_clk64 130.

At point "B" 296, initialization is considered to be complete. The combination of the 3 bits of phase_sel 182 and the initial conditions placed into the d2 and the d4 flip flops 150, 160 mean that the hardware is primed and is able to create the precise waveform on "clk16" that is required.

Continuing to refer to FIG. 2, the time between "A" 295 and "B" 296 is a half-cycle of the highest-speed clock, but the required length of time will be dependent on the technology parameters specific to the implementation and the type of flip-flops used.

Once the initialization is complete, multiple different signals are asserted by gates 164 and 165 that could potentially be used for the primary clock gater 168 (the "AND" gate). The mux 166 selects a version of the gating signal that will meet standard setup timing constraints and hold timing constraints within the clock gater latch 167.

Point "C" 297 is the first "usable" clock edge which is made visible to the clock divider after the forced set/reset signals are de-asserted. From this point forward, the circuit behaves as a traditional divide-by-four clock divider that will run continuously until new control commands are passed through the FIFO 170 that instruct the circuit to change these timing parameters again.

The amount of time between "A" 295 (where the clock behavior changed) and "D" 298 (where the first meaningful rising edge is available on the output clock) is less than half a cycle of the output clock. For different clocks picked in the [0,31] range, the exact delay will be different, but it will always be very small. In comparison, conventional solutions using a DLL or phase interpolators may often require a full cycle, or even two to three cycles of time in the output clock domain.

The embodiments described may be used in other configurations such as in (or in conjunction with) a standalone means for providing clocks to a memory (e.g., DDR3) system.

Although features and elements are described above in particular combinations, each feature or element can be used alone without the other features and elements or in various combinations with or without other features and elements. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of processors, one or more processors in association with a DSP core, a controller, a microcontroller, Application Specific Integrated Circuits (ASICs), Field Programmable Gate Arrays (FPGAs) circuits, any other type of integrated circuit (IC), and/or a state machine.

Embodiments of the invention may be represented as instructions and data stored on a computer readable memory. For example, aspects of the invention may be included in a hardware description language (HDL) code stored on such computer readable media. Such instructions, when processed may generate other intermediary data (e.g., netlists, GDS data, or the like) that can be used to create mask works that are adapted to configure a manufacturing process (e.g., a semiconductor fabrication facility). Once configured, such a manufacturing process is thereby adapted to manufacture processors or other semiconductor devices that embody aspects of the present invention.

What is claimed is:

1. A method of phase selection acceleration comprising:
   multiplying, by a phase locked loop (PLL), a clock signal so as to generate a plurality of clock signals, each of the plurality of clock signals having a phase shift;
   selecting one of the plurality of clock signals based on a phase of the clock signal; and
   dividing the selected clock signal in a phase-controlled manner to create a fractional speed output clock signal.

2. The method of claim 1, wherein the plurality of clock signals have phases with a resolution of 1/32 of a unit interval and the PLL has a bandwidth in a range of 100 to 300 megahertz, wherein a unit interval is a duration of one data bit over a transmission medium.

3. The method of claim 1, wherein the plurality of clock signals is eight clock signals.

4. The method of claim 1, wherein the fractional speed output clock signal is a one quarter speed output clock.

5. The method of claim 1, wherein the selecting of the clock signal has less than or equal to one unit interval of dead time.

6. The method of claim 1, wherein the selecting of the clock signal is based on a first information from a minimal logic entity.

7. The method of claim 6, wherein the minimal logic entity receives a second information from a first in first out (FIFO) entity.

8. The method of claim 7, wherein the second information includes a phase and gate settings.

9. The method of claim 6, wherein the first information includes a phase setting and at least one control bit.

10. A computer-readable storage medium storing design code representing hardware design of a processor that is to perform a method to provide phase selection acceleration, the method comprising:
  receiving, by a phase locked loop (PLL), a clock signal;
  multiplying, by the PLL, the clock signal and generating a plurality of clock signals, each of the plurality of clock signals having a phase shift;
  selecting one of the plurality of clock signals based on a phase of the clock signal; and
  dividing the selected clock signal in a phase-controlled manner to create a fractional speed output clock signal.

11. The computer-readable storage medium of claim 10, wherein design code comprises hardware description language (HDL) instructions used for the manufacture of a device including the processor.

12. An apparatus comprising:
  a phase locked loop (PLL) configured to receive a clock signal, multiply the clock signal and generate a plurality of clock signals, each of the plurality of clock signals having a phase shift;
  a multiplexer configured to select a selected clock signal from one of the plurality of clock signals based on a phase of the clock signal; and
  a clock signal dividing apparatus configured to divide the selected clock signal in a phase-controlled manner to create a fractional speed output clock signal.

13. The apparatus of claim 12, wherein the plurality of clock signals have phases with a resolution of 1/32 of a unit interval and the PLL has a bandwidth in a range of 100 to 300 megahertz, wherein a unit interval is a duration of one data bit over a transmission medium.

14. The apparatus of claim 12, wherein the plurality of clock signals is eight clock signals.

15. The apparatus of claim 12, wherein each of the plurality of clock signals has a predefined phase shift.

16. The apparatus of claim 12 wherein:
  the fractional speed output clock signal is based at least in part on clock gater logic.

17. The apparatus of claim 16, wherein the fractional speed output clock signal is a one quarter speed output clock.

18. The apparatus of claim 12, wherein transition from the received clock signal to the selected clock signal has a less than or equal to one unit interval of dead time.

19. The apparatus of claim 12, further comprising a minimal logic entity for sending a phase selection setting from which the selected clock signal is based.

* * * * *